United States Patent
Chen et al.

(10) Patent No.: US 6,911,097 B1
(45) Date of Patent: Jun. 28, 2005

(54) PHOTORESIST STRIPPER USING NITROGEN BUBBLER

(75) Inventors: Chie-Chi Chen, Kaohsiung (TW); Wen-Hsiang Tseng, Hsinchui (TW); Sheng-Liang Pan, Hsin-Chu (TW); Jen-Shiang Fang, Hsin-Chu (TW)

(73) Assignee: Taiwan Semiconductor Manufacturing Company (TW)

( * ) Notice: Subject to any disclaimer, the term of this patent is extended or adjusted under 35 U.S.C. 154(b) by 0 days.

(21) Appl. No.: 09/629,213

(22) Filed: Jul. 31, 2000

(51) Int. Cl.$^7$ ................................................. B08B 5/00
(52) U.S. Cl. ........................... 134/31; 134/2; 134/25.1; 134/25.4; 134/34; 134/37; 134/102.2; 438/906
(58) Field of Search ......................... 134/2, 25.1, 25.4, 134/34, 37, 102.2, 11, 25.6, 30, 31, 151, 147, 137, 102.1, 61, 76, 82, 902; 438/906; 216/57, 83

(56) References Cited

U.S. PATENT DOCUMENTS

| | | | |
|---|---|---|---|
| 3,799,179 A | * 3/1974 | Thomas | 134/95.1 |
| 4,251,317 A | 2/1981 | Foote | 156/639 |
| 4,586,961 A | * 5/1986 | Bradley et al. | 134/2 |
| 5,014,727 A | * 5/1991 | Aigo | 134/102.2 |
| 5,082,518 A | 1/1992 | Molinaro | 156/345 |
| 5,464,480 A | 11/1995 | Matthews | 134/1.3 |
| 5,704,981 A | 1/1998 | Kawakami et al. | 118/715 |
| 5,776,296 A | 7/1998 | Matthews | 156/345 |
| 5,849,091 A | * 12/1998 | Skrovan et al. | 134/1 |
| 5,868,898 A | 2/1999 | Liu et al. | 156/345 |
| 5,904,156 A | * 5/1999 | Advocate et al. | 134/2 |
| 5,954,885 A | 9/1999 | Ohmi | 134/1.3 |

FOREIGN PATENT DOCUMENTS

JP  11-121419  * 4/1999

OTHER PUBLICATIONS

Merriam–Webster's Collegiate Dictionary, Tenth edition, 1999. p. 223.*

* cited by examiner

Primary Examiner—M. Kornakov

(57) ABSTRACT

Provided is a process and apparatus characterized by a gas distribution plate in which a gas supply manifold directs gas bubbles from the bottom of a process tank upward and between wafers contained in a cassette and supported therewithin. This improved method and apparatus is used for effectively stripping photoresist from the larger semiconductor wafers having dense top conductive patterns with protuberant sidewalls. The method provides a scrubbing action that is parallel to the device array being formed on the wafer's surface. Broadly stated, the method of a chemical action on large substrates supported adjacent respective edge portions thereof in a carrier includes submerging the carrier and substrates supported thereby in a process tank containing a liquid chemical, and a gas distribution plate disposed on the bottom of the tank for directing gas bubbles upward and parallel to the surfaces of each substrate contained in the carrier to ensure that a uniform chemical action occurs.

8 Claims, 5 Drawing Sheets

FIG. 1 - Prior Art

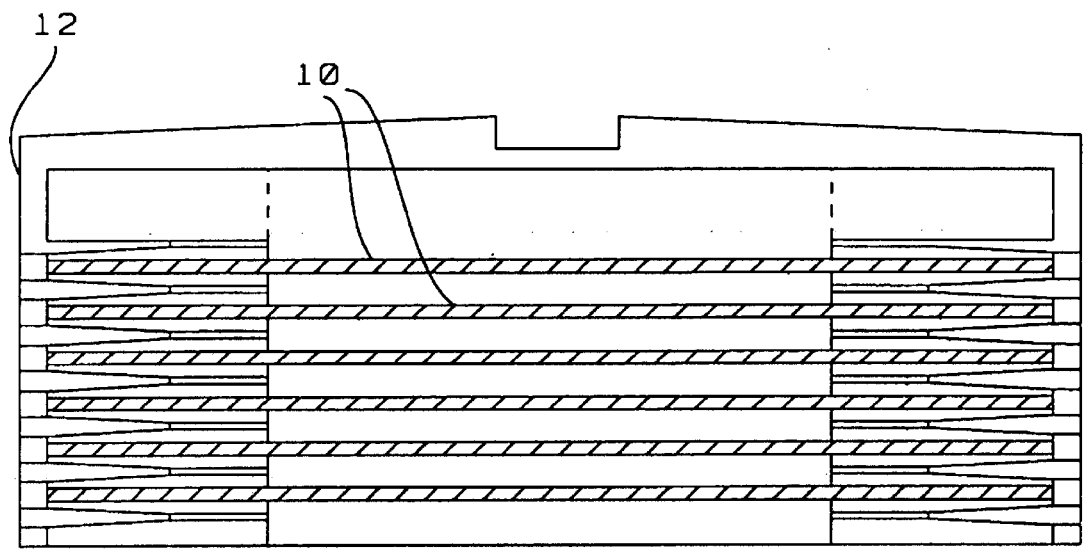
FIG. 5 - Prior Art
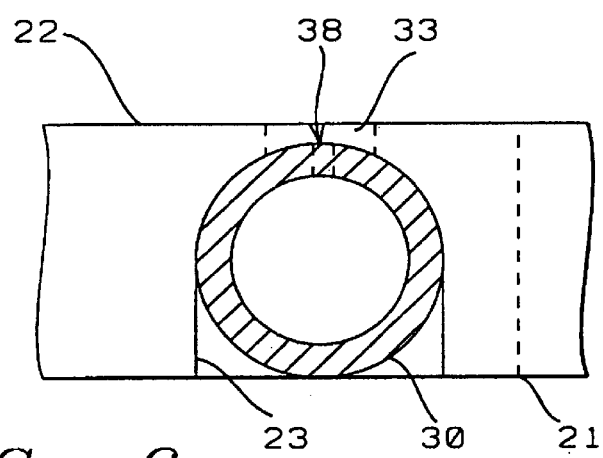
FIG. 6

PHOTORESIST STRIPPER USING NITROGEN BUBBLER

BACKGROUND OF THE INVENTION (1) Technical Field

The present invention relates to semiconductor manufacturing. More specifically, the invention teaches an improved fluid application systems for stripping photoresist from silicon wafers, particularly wafers having dense top metal circuit patterns with sidewalls which obscure residual photoresist, and the like.

(2) Description of the Prior Art

The following four documents relate to methods dealing with stripping and cleaning of substantially planar objects.

U.S. Pat. No. 4,251,317 issued Feb. 17, 1981 to Foote, shows a gas bubbler in combination with a wafer cassette rotation within a wet wafer cleaning tank.

U.S. Pat. No. 5,868,898 issued Feb. 9, 1999 to Liu et al., shows a wet wafer cleaning tank with a fluid distributor to agitate the stripper and form bubbles.

U.S. Pat. No. 5,704,981 issued Jan. 6, 1998 to Kawakami et al., recites a buffer plate for distributing gas in a reactor.

U.S. Pat. No. 5,954,885 issued Sep. 21, 1999 to Ohmi, shows a cleaning method using wet tanks and ultrasound.

U.S. Pat. No. 5,464,480 issued Nov. 7, 1995 to Matthews, shows a gas diffuse for a organic stripping/cleaning tank.

During the forming of integrated circuits on semiconductor wafers, several process steps require submersing the wafers in liquid chemicals contained in an immersion tank is generally a practical high-throughput, flexible fabrication process. Examples include, chemical etching, photoresist stripping, and wafer cleaning. In a typical wet chemical process tank, in order to ensure a perfect mix of acids, detergents and the like or a good uniformity in the acid itself, constant stirring or agitation of the solution in the tank is desired. While mechanical stirring or agitation techniques have been used, the moving components of a stirrer frequently generate contaminant particles that are detrimental to the wafer surfaces. An example of a chemical process system equipped with a bubbler and a mechanical cassette rotating apparatus is shown in FIG. 1.

The apparatus illustrated schematically in FIG. 1 is of the prior art. As shown in that figure, is a tank 10 which contains liquid etchant 12 in the form of an acid bath. The tank has a mechanism 20 mounted thereto, wherein a housing 22 is rotatably mounted and driven with a sprocket and chain combination 30 by a motor (not shown). A cassette 40 containing wafers 42 is supported therewithin housing 22. The housing 22 and cassette 40 have appropriate openings therein so that etchant 12 may reach the wafers 42. A manifold 54 running transversely and adjacent the bottom of the tank 10. The longitudinal axis of the manifold 54 being substantially parallel to and directly below the axis of rotation of the housing 22. The manifold 54 defines a plurality of evenly-spaced openings along the upper surface thereof. Nitrogen gas is supplied through tubes 52. The gas bubbles 60 travel in a direction 62 generally perpendicular to the axis of rotation of the cassette 40.

The fabrication of integrated circuits on a semiconductor wafer involve a number of steps where patterns are exposed through lithographic photomasks into a photosensitive resist covering the wafer. After developing, open areas in the photoresist permit subsequent processes such as inclusion of impurities, oxidation, etching, and metalization to be performed. The photoresist is thereafter stripped from the wafer following each of the aforementioned process steps. From a chemical reaction point of view, conventional methods for stripping photoresist have low reaction rates due to the low collision frequency between the stripper and photoresist molecules. Furthermore, from a thermodynamics point of view, the activation energy of photoresist molecules dissolving into the stripper is intensified under static conditions, thus leaving residues on the wafers in view of the fact that an incomplete chemical reaction takes place in a limited processing time. The process suffers the risk of re-depositing the dissolved impurities onto the wafer in a viscous static stripper due to the low solubility of the photoresist.

During latter stages of circuit fabrication, the forming of various metal conductive layers transform the wafer's topographic surface into a three dimensional maze of metal circuit lines that are closely separated, thereafter, making the circuit line's sidewall height proportional in size to its width and spaces. The process of stripping the photoresist from between these three dimensional circuit lines becomes increasingly challenging, particularly on the 6 and 8 inch diameter wafers. Residues left behind are harmful contaminants to the microscopic circuits which the fabrication process creates.

The apparatus of FIG. 1, having a rotating mechanism immersed in the process chemical, conventionally used when etching wafers, is not recommended for use during photoresist stripping or for cleaning wafers because of particulate generated by the cassette rotating drive members, hence, contaminating the process chemicals and also the wafers being processed.

SUMMARY OF THE INVENTION

It is therefore a primary object of the present invention to provide a method for effectively stripping obscured photoresist or other organic materials from semiconductor wafers having dense top surface conductive patterns with prominent sidewalls.

Another object of the present invention is to provide an apparatus that manifests a scrubbing action with a directional agitation of the viscous stripper that is against the immersed wafer's surface using nitrogen bubbles moving upward and parallel to the dense top surface conductive patterns thus increasing the collision frequency between the stripper and photoresist molecules.

It is yet another object of the present invention to increase the throughput due to the efficient stripping rate promoted by increased solubility.

It is still another object of the present invention to prolong the lifetime of the stripper by reducing the stripping process time.

It is still another object of the present invention to improve the stripping uniformity within a wafer and to eliminate the boundary condition of the tank.

In accordance with the objects of this invention a new and improved method and apparatus for effectively stripping photoresist from the large diameter semiconductor wafers having dense top surface conductive patterns with protuberant sidewalls is achieved. The method provides a scrubbing action that is parallel to the device array being formed on the wafer's surface. Broadly stated, the method of a chemical action on large wafers supported adjacent respective edge portions thereof in a cassette includes submerging the cassette and wafers supported thereby in a tank containing a liquid chemical, and a gas distribution plate disposed on the bottom of the tank for directing nitrogen bubbles upward and parallel to the surfaces of each wafer contained in the cassette to ensure that a uniform and accelerated chemical action occurs. This novel method and apparatus would be of great value to the semiconductor industry.

DESCRIPTION OF THE DRAWINGS

FIG. 5 is an enlarged plan view of a portion of a cassette used for supporting wafers during processing, showing wafers contained therein.

FIG. 6 is an enlarged view showing the edge portion of the sinuous groove with a cross-section of the flexible tube therein.

DETAILED DESCRIPTION OF THE PREFERRED EMBODIMENT

Figure 1:
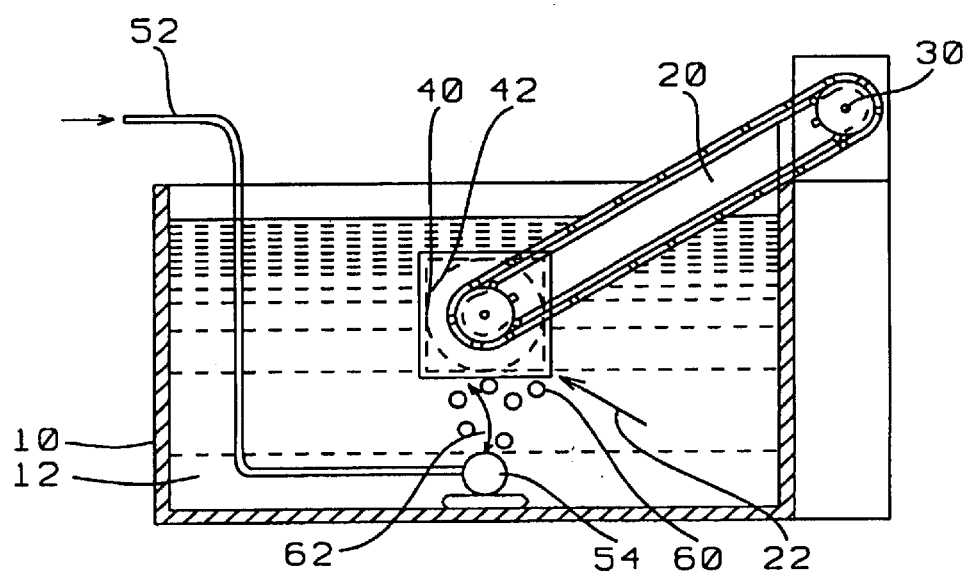
FIG. 1 illustrates a side elevation of an etching tank of the prior art.
Figure 2:
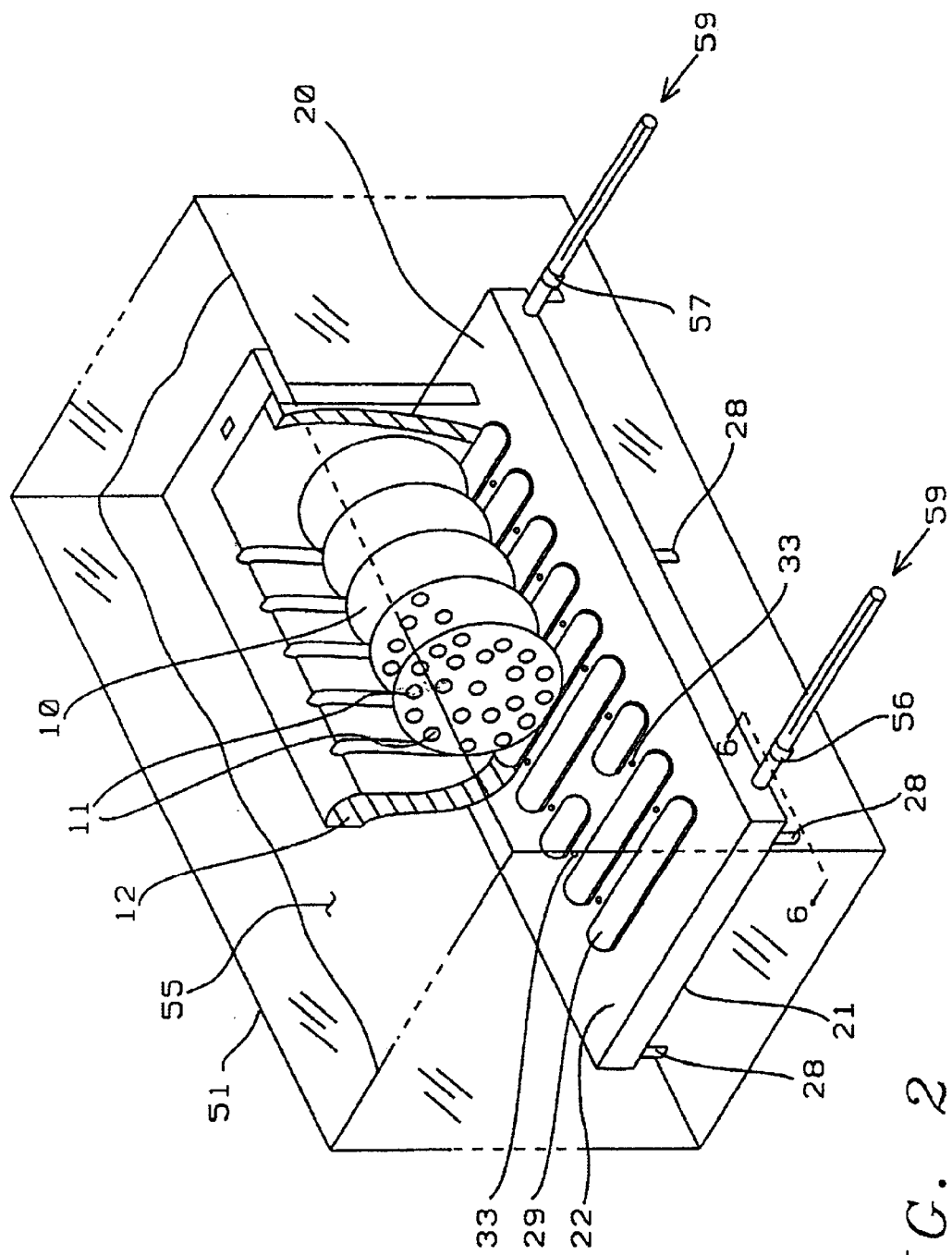
FIG. 2 is a perspective side elevation view of the apparatus for practicing the present invention.

In a preferred embodiment, the process of the invention is conducted by the apparatus of FIG. 2, is characterized by a gas distribution plate 20 in which a gas supply manifold directs gas bubbles 11 from the bottom of a process tank 51 upward and between wafers 10 contained in a cassette 12 and supported therewithin. This improved method and apparatus is used for effectively stripping photoresist from the larger semiconductor wafers having dense top conductive patterns with protuberant sidewalls. The method provides a scrubbing action that is parallel to the device array being formed on the wafer's surface. Broadly stated, the method of a chemical action on large substrates supported adjacent respective edge portions thereof in a carrier includes submerging the carrier and substrates supported thereby in a process tank containing a liquid chemical, and a gas distribution plate disposed on the bottom of the tank for directing gas bubbles upward and parallel to the surfaces of each substrate contained in the carrier to ensure that a uniform chemical action occurs. This novel method and apparatus would be of great value to the semiconductor industry.

The process tank 51, illustrated in FIG. 2, is equipped with a gas distribution plate 20 for generating and directing gas bubbles 11 egressing in an upward direction and below a stationary plurality of semiconductor wafers 10 supported adjacent respective edge portions thereof while in a cassette 12. A fragmented view of the cassette 12 and tank 51 are shown to depict the bubble action against the surfaces of wafers. The open process tank 51 having two sidewalls and two endwalls perpendicularly joined to a bottom wall for holding a process chemical 55. Two ports are located at opposite ends of a sidewall and proximal the bottom wall, each port containing a leakproof bulkhead fitting 56, 57 to facilitate connection for transmitting a pressurized and regulated gas supply 59 to the gas distribution plate 20.

Figure 3:
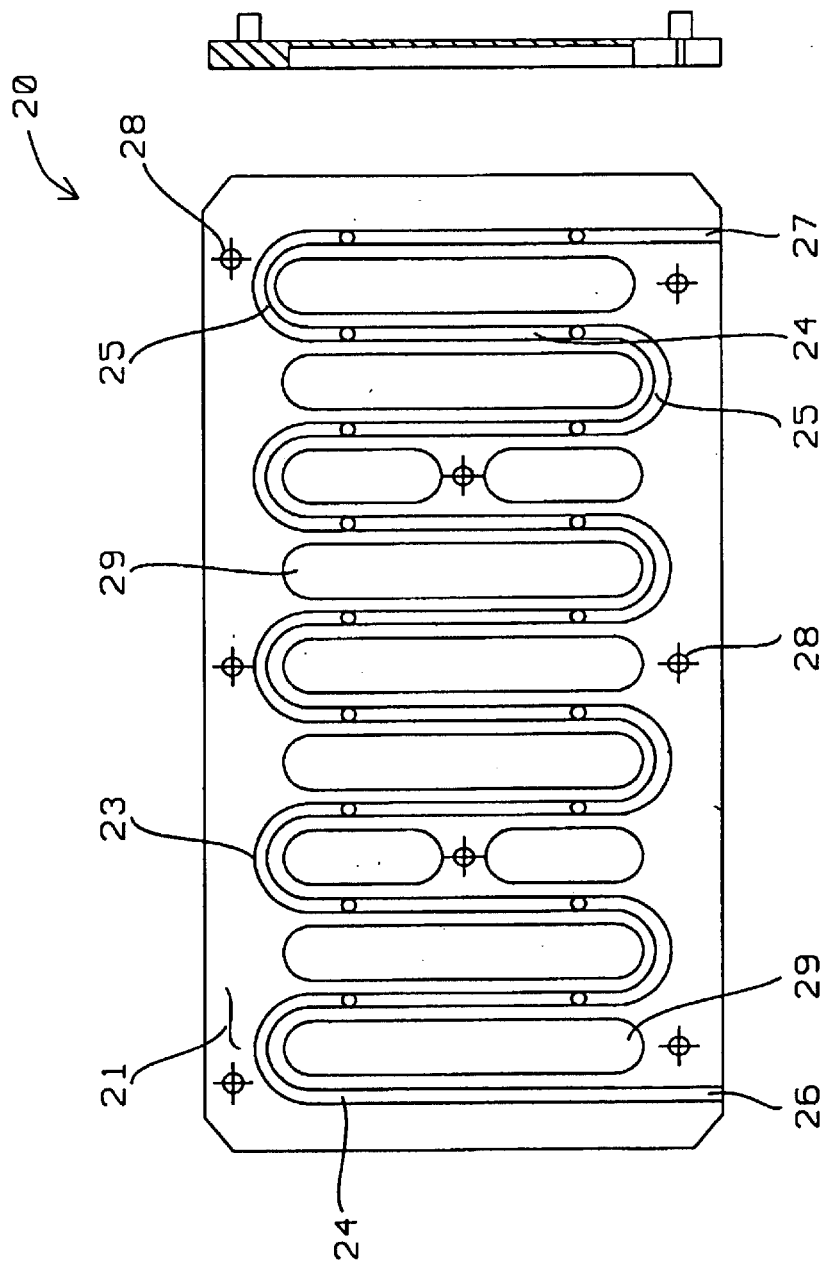
FIG. 3 is a bottom view illustration of the gas distribution plate of the invention.

A gas distribution plate 20 (GDP) having a top surface 22 separated from a bottom surface 21, is placed and supported by the bottom wall of tank 51 as best illustrated in FIG. 2. For a more comprehensive and detailed description of the gas distribution plate 20, refer to FIGS. 3 and 4. The bottom surface 21 illustrated in FIG. 3 has a sinuous groove 23 shaped to form a plurality of parallel circuit legs 24 transversing the length of GDP 20, with alternate turnarounds 25 for establishing continuity, the circuit legs 24 have a periodicity matching the spacing between wafers 10 held in a process cassette 12. The cassette, conventionally used is illustrated in FIG. 5. Sinuous groove 23 has a first path 26, and a second path 27 located on the same side and at opposite ends of the GDP, extending therethrough the side edge, as best illustrated in FIG. 6, of the gas distribution plate 20. A flexible tubing 30 is urged and guided into the length of the sinuous groove 23 extending therefrom first and second paths 26, 27 and connected thereto respective ports 56, 57 completing therein a circuit for conveying a pressurized and regulated gas supply to both paths leading to GDP 20. A multiplicity of spacers 28 are affixed to the bottom surface 21 raising the GDP off the bottom wall of process tank 51 facilitates flushing of the tank with a cleaning solvent between draining of degraded stripper and refilling with a fresh supply. In addition, elongated and open slots 29 running therethrough allow direct passage to the tank bottom for a more surface accessibility during flushing of the tank.

Figure 4:
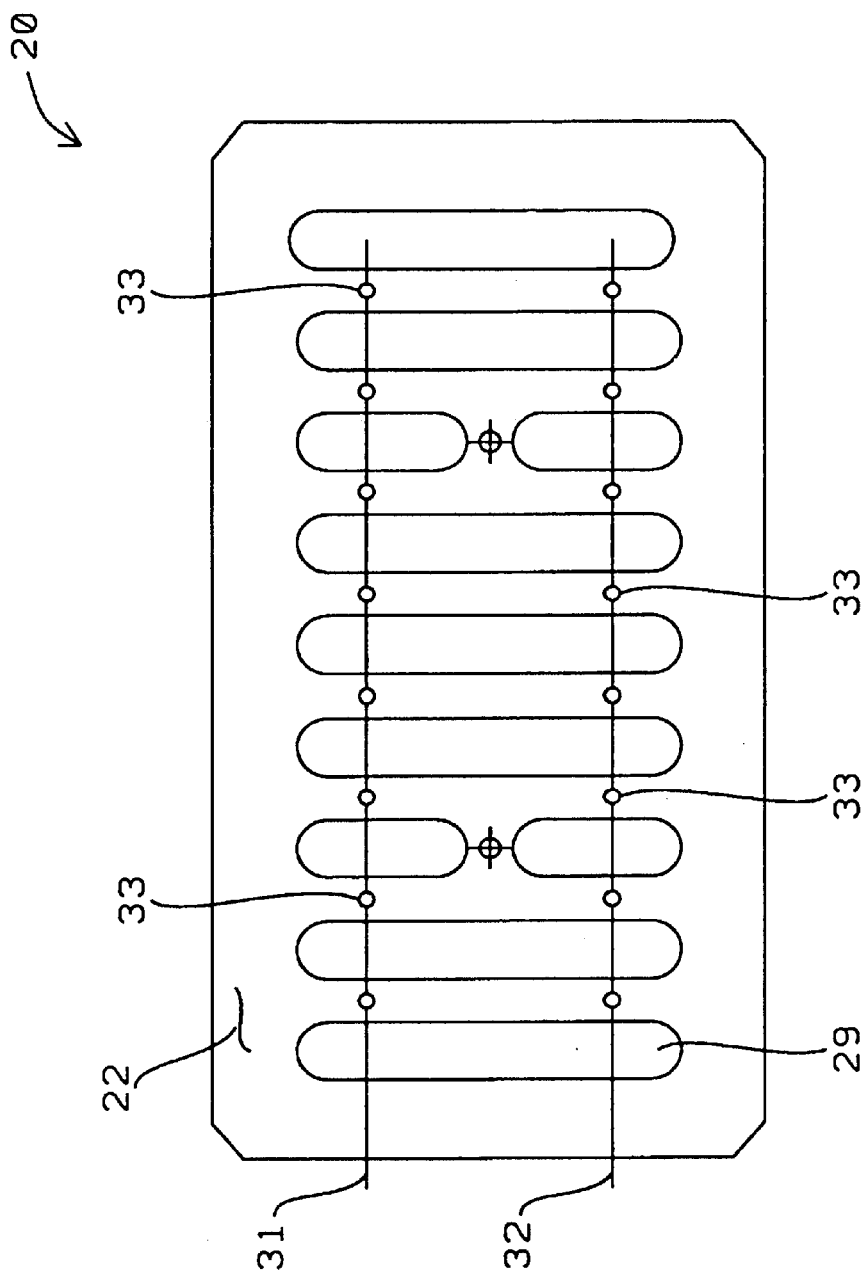
FIG. 4 is a top view illustration of the gas distribution plate of the invention.

As shown in FIG. 4, the top surface of the gas distribution plate 20 has two rows 31 and 32 of holes 33, each of the rows widely separated from one another, and containing holes 33 that are equally spaced and paired opposite one another. The pairs of holes, transversing the length of GDP 20, are in alignment with and intersecting the center width of each circuit leg 24 located thereunder. After the flexible tubing 30 is inserted into sinuous groove 23, holes 38 are drilled to break through the top side of the tubing 30. The location of the holes 38, as best illustrated in FIG. 6, are guided thereof by the holes making up the two rows 32, 31 on the top surface of the distribution plate.

The process of enhancing the scrubbing action for stripping photoresist from semiconductor wafers 10, particularly the larger wafers having dense top conductive patterns with protuberant sidewalls, can now begin. A plurality of wafers 10, supported apart each other by adjacent respective edge portions are contained within a cassette 12. The spacing between wafers approximately matches the spaces between circuit legs 24. The wafers 10 are supported vertically adjacent respective edge portions thereof while in the cassette 12 with appropriate openings therein so that the liquid stripping chemical contained in process tank 51 may reach the wafers. The cassette is submersed in the liquid stripper for soaking. A valve is opened, not shown, directing nitrogen and forming bubbles created by escaping nitrogen gas egressing holes 33 provided in tubing 30 traveling upward while scrubbing the surfaces of the wafers. It becomes quite evident that a highly efficient and effective method of stripping photoresist from semiconductor wafers is herewith disclosed.

While the invention has been particularly shown and described with reference to the preferred embodiments thereof, it will be understood by those skilled in the art that various changes in form and details may be made without departing from the spirit and scope of the invention.

What is claimed is:

1. A method for removing coatings from a plurality of substrates comprising the steps of:

providing a substrate carrier containing a plurality of substrates;

providing a tank containing a liquid chemical;

placing a gas distribution plate on a bottom of said tank, said gas distribution plate having a groove for guiding a flexible tubing;

drilling a linear array of holes in said flexible tubing;

connecting said flexible tubing to a pressure regulated gas supply;

positioning said substrate carrier on said gas distribution plate so that a linear array of gas bubbles flowing upwards scrub surfaces between each substrate.

2. The method according to claim 1 wherein a plurality of lines of gas bubbles forms patterns that correspond to each substrate contained in said substrate carrier.

3. The method according to claim 1, wherein said pressure regulated gas supply is nitrogen gas.

4. The method according to claim 1 wherein a gas distribution plate and a flexible tubing are each compatible with aggressive chemicals used for removing residues in sidewalls that are coated with an organic material.

5. A method for stripping photoresist from a plurality of semiconductor wafers, comprising the steps of:

providing a wafer cassette containing a plurality of wafers;

providing a tank containing a photoresist stripping chemical;

providing a gas distribution plate and placing it on a bottom of said tank, said gas distribution plate having a groove for guiding a flexible tubing;

drilling a linear array of holes in said guided flexible tubing;

connecting said flexible tubing to a pressure regulated gas supply; and positioning said wafer cassette on said gas distribution plate so that a linear array of gas bubbles emanating from holes drilled in said flexible tubing, flow upwards, therein scrubbing the surfaces of each wafer.

6. The method according to claim 5 wherein said gas distribution plate has a gas distribution pattern for generating rows of gas bubbles, each row corresponding to a wafer position in said wafer cassette.

7. The method according to claim 5 wherein a gas distribution plate and a flexible tubing are both compatible with aggressive chemicals for removing residues.

8. The method according to claim 5 wherein said pressure regulated gas supply is nitrogen gas.

* * * * *